United States Patent
Ordentlich et al.

(10) Patent No.: US 9,952,796 B2
(45) Date of Patent: Apr. 24, 2018

(54) DATA STORING IN MEMORY ARRAYS

(71) Applicant: Hewlett Packard Enterprise Development LP, Houston, TX (US)

(72) Inventors: Erik Ordentlich, San Jose, CA (US); Ron M. Roth, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/113,890

(22) PCT Filed: Jan. 31, 2014

(86) PCT No.: PCT/US2014/014027
§ 371 (c)(1),
(2) Date: Jul. 25, 2016

(87) PCT Pub. No.: WO2015/116136
PCT Pub. Date: Aug. 6, 2015

(65) Prior Publication Data
US 2016/0350000 A1    Dec. 1, 2016

(51) Int. Cl.
*G11C 29/00*    (2006.01)
*G06F 3/06*    (2006.01)
(Continued)

(52) U.S. Cl.
CPC ............ *G06F 3/064* (2013.01); *G06F 3/0619* (2013.01); *G06F 3/0644* (2013.01);
(Continued)

(58) Field of Classification Search
CPC ......... H03M 13/2942; H03M 13/1137; H03M 13/116; H03M 13/6362; H03M 13/118;
(Continued)

(56) References Cited

U.S. PATENT DOCUMENTS 7,646,625 B2    1/2010   Philipp et al.
7,778,061 B2    8/2010   Robinett et al.
(Continued)

OTHER PUBLICATIONS

Jacobvitez, A.N., et al., Coset Coding to Extend the Lifetime of Memory, Dec. 17, 2012, 19th IEEE International Symposium on High Performance Computer Architecture, 12 pages.

(Continued)

*Primary Examiner* — Guerrier Merant
(74) *Attorney, Agent, or Firm* — Michael A. Dryja (57) ABSTRACT

Methods and systems for storing data in memory arrays are described. In one implementation, input bits are encoded into an intermediate binary array having multiple sub-arrays iteratively appended row-wise to the intermediate binary array. First sub-array is generated based on the input bits such that each row of the first sub-array has a number of 1's equal to a fraction of number of columns in the first sub-array, and based on a column balance coding such that the columns of the first sub-array have an equal number of 1's. At least one subsequent sub-array is generated based on a set of bits obtained from balancing termination indices for a previous sub-array and from diagonal bits of the intermediate binary array that are a part of the previous appended sub-array. The intermediate binary array is transformed to an encoded bit pattern. The encoded bit pattern is stored in the memory array.

15 Claims, 8 Drawing Sheets

(51) Int. Cl.
   *G06F 12/02* (2006.01)
   *G06F 12/06* (2006.01)
   *G06F 11/10* (2006.01)
   *G11C 29/52* (2006.01)
   *G11C 29/04* (2006.01)

(52) U.S. Cl.
   CPC ........ *G06F 3/0679* (2013.01); *G06F 11/1068* (2013.01); *G06F 12/0238* (2013.01); *G06F 12/0607* (2013.01); *G11C 29/52* (2013.01); *G11C 2029/0411* (2013.01)

(58) Field of Classification Search
   CPC .......... H03M 13/1174; H03M 13/1117; H03M 13/1122; H03M 13/114; H03M 13/6566; H03M 13/635; H03M 13/1171; H03M 13/611; H03M 13/616; H03M 13/1111; H03M 13/15; G06F 11/1068
   See application file for complete search history.

(56) References Cited

U.S. PATENT DOCUMENTS

| | | |
|---|---|---|
| 7,778,070 B2 | 8/2010 | Nirschl et al. |
| 8,441,836 B2 | 5/2013 | Parkinson et al. |
| 2010/0265552 A1 | 10/2010 | Wang et al. |
| 2011/0266510 A1 | 11/2011 | Quitoriano et al. |
| 2012/0147672 A1 | 6/2012 | Radke |
| 2013/0051121 A1 | 2/2013 | Yang et al. |
| 2013/0121062 A1 | 5/2013 | Ordentlich et al. |

OTHER PUBLICATIONS

International Search Report & Written Opinion, dated Oct. 29, 2014, PCT Patent Application No. PCT/US20141/014027, 9 pages.
Hajimiri, H., et al., Content-aware Encoding for Improving Energy Efficiency in Multi-Level Cell Resistive Random Access Memory [online], Jun. 14, 2013, Retrieved from the Internet: <http://esl.cise.ufl.edu/Publications/nanoarch13_encoding.pdf> [retrieved on Dec. 20, 2013], 6 pages.

DATA STORING IN MEMORY ARRAYS

BACKGROUND

Recent advancements in non-volatile memories have led to the development of memristor-based memory devices that offer high storage capacity and high read-write speeds. A memristor, or a memristive device, is a resistive switching device that can be programmed to be in a low resistive state or a high resistive state. The low resistive state and the high resistive state of a memristor can be representative of digital data storage in binary form, with the low resistive state indicating a "1" storage and the high resistive state indicating a "0" storage. The resistive state of a memristor can also be changed from a low to a high, and vice versa, to switch between the "0" storage and the "1" storage in the memristor.

A memristor-based memory array is formed by multiple nanoscale memristors arranged in a crossbar configuration. Such a memory array is highly scalable and provides a high storage capacity that can be utilized in non-volatile memory applications.

BRIEF DESCRIPTION OF DRAWINGS

The detailed description is provided with reference to the accompanying figures. In the figures, the left-most digit(s) of a reference number identifies the figure in which the reference number first appears. The same numbers are used throughout the drawings to reference like features and components.

FIG. 2($a$) illustrates a data storage system having a memristor-based memory array, according to an example of the present subject matter.

FIG. 2($b$) illustrates a data storage system, according to an example of the present subject matter.

FIGS. 3($a$) and 3($b$) show generation of an intermediate binary array by encoding an input data of $s_1$ input bits, according to an example of the present subject matter.

DETAILED DESCRIPTION

The present subject matter relates to methods and systems for storing digital data into a memory array having memory devices in a crossbar configuration. The memory devices may be memristive devices, also referred to as memristors. In a crossbar configuration, the memory array has a first set of substantially parallel nanowires on top, and a second set of substantially parallel nanowires, aligned at about 90° to the first set, at bottom. A memristor is disposed at each point of intersection of the top and the bottom nanowires to form a row-column arrangement of memristors. The memristors in the memory array can be programmed to store digital data in binary form, i.e., in the form of 0's and 1's.

For data storage in a memory array, an input data may be encoded into a binary array, and the encoded binary array may then be stored in the memory array. The resistive state of one memristor in the memory array is indicative of a state of one bit of the encoded binary array, with the resistive states of memristors in rows and columns of the memory array matching the 0's and 1's in the respective rows and columns of the encoded binary array. To write a 0 or a 1 in a memristor, the memristor is selected uniquely by selecting the corresponding row and column of the memory array and a characteristic store-voltage is applied across the selected memristor for storing 1 or 0. Depending on the store-voltage, the memristor can be set to a low resistive state to store a "1" or can be set to a high resistive state to store a "0". To retrieve the data stored in the memory array, each memristor is read to determine its resistive state. For this, each memristor is selected uniquely by selecting the corresponding row and column of the memory array and a characteristic read-voltage is applied across the selected memristor to determine its resistance. The applied read-voltage is lower than the applied store-voltage to ensure that the resistance of the memristor is not varied by the read-voltage.

During the writing or the reading of a selected memristor, other memristors in the same row or column of the selected memristor are half-selected as they experience a substantial voltage drop across them. If a large number of half-selected memristors in a row or a column are in low resistive states, i.e., store 1's therein, then the amount of current drawn by those half-selected memristors may be substantially large. Such a large current is referred to as a parasitic current, which may damage the memory array due to high heat dissipation or high electro-migration, and may result in power wastage due to the large current draw.

Further, during the reading or the writing of data in a memory array, bit-transition errors may be observed. The bit-transition errors are referred to as differences in one or more bit values in the binary array that is read from the memory array with respect to the binary array that is written in the memory array. The bit-transition errors affect the accuracy of input data retrieved from the memory array.

Methods and systems for storing digital data into a memory array having memory devices, such as memristors, in a crossbar configuration are described herein. With the methods and the systems of the present subject matter, the number of memory devices in each row and in each column of the memory array that are in the low resistive state may be controlled to be no larger than a predefined fraction of the number of columns and rows, respectively. This facilitates controlling the parasitic current during the reading and the writing stage. Also, with the methods and the systems of the present subject matter, error correction parity bits may be incorporated during encoding of input data, which may facilitate detecting and correcting the bit-transition errors that may occur during the reading or the writing stage.

In an example implementation, data for storing in the memory array is encoded into an intermediate binary array having multiple sub-arrays. Each sub-array has combinations of 0's and 1's in rows and columns. The data to be stored is referred to as the input data for the memory array. The intermediate binary array is generated by iteratively generating the multiple sub-arrays and row-wise appending each of the multiple sub-arrays, after each iteration, to the intermediate binary array. In the first iteration, a first sub-array is generated based on the input data such that each row of the first sub-array has $\alpha \times n$ 1's, and based on a column balance coding on the first sub-array such that the columns of the first sub-array have an equal number of 1's. Here, n is the number of columns in the first sub-array, and α is a predefined fraction of 1. In an example, the predefined fraction α may be of the form of $½^t$, where t is an integer, and n may be of the form $2^k$ where k is an integer greater than or equal to t. The first sub-array is set as the intermediate binary array, obtained after the first iteration.

After the first iteration, one or more subsequent sub-arrays are iteratively generated, and, after the respective iteration, the intermediate binary array is updated by appending the subsequent sub-array to the intermediate binary array from the previous iteration. In an example implementation, each subsequent sub-array is generated based on a set of bits obtained from balancing termination indices for a previous sub-array and from diagonal bits of the intermediate binary array that are a part of the previous sub-array, appended row-wise to the intermediate binary array. A balancing termination index for a sub-array is indicative of a position of a bit of the sub-array at which a column balancing procedure is terminated. For example, in the second iteration, a second sub-array is generated by encoding a set of bits obtained through the balancing termination indices for the first sub-array and through the diagonal bits of the intermediate binary array that are a part of the first sub-array. The second sub-array is appended to the first sub-array in the intermediate binary array. In the third iteration, a third sub-array is generated by encoding a set of bits obtained through the balancing termination indices for the second sub-array and through the diagonal bits of the intermediate binary array that are a part of the second sub-array after it is appended row-wise to the first sub-array in the intermediate binary array. Similarly, in the last iteration, a last sub-array is generated by encoding a set of bits obtained through the balancing termination indices for the previous sub-array and through the diagonal bits of the intermediate binary array that are a part of the newly appended previous sub-array. The iterations are terminated based on the length of the set of bits obtained for the subsequent iteration.

Further, the intermediate binary array, obtained after appending the last sub-array, is transformed to a 2-dimensional (2D) encoded bit pattern, and the 2D encoded bit pattern is stored in the memory devices of the memory array. The 2D encoded bit pattern is hereinafter referred to as the encoded bit pattern. The intermediate binary array is transformed to the encoded bit pattern by adding error correction parity bits. It may be noted that the error correction parity bits enable detection and correction of one or more bit-transition errors that may occur during storage of the encoded bit pattern in, and/or retrieval of the encoded bit pattern from, the memory array. For the transformation, in an example implementation, positions of the diagonal bits of the intermediate binary array except for those of the last appended sub-array are reserved for the error correction parity bits. Such positions are reserved as said diagonal bits are encoded in each successive sub-array. The bits in the non-reserved positions in the intermediate binary array are then coded to compute the error correction parity bits. The error correction parity bits are inserted in the reserved diagonal positions to obtain the encoded bit pattern.

Further, to retrieve the input data from the memory array, the memory array is read and a bit pattern is obtained. The bit pattern read from the memory array may include one or more bit-transition errors therein. In an example implementation, the bit pattern, read from the memory array, is decoded to detect and correct the bit-transition errors. The bit pattern obtained after the correction of the bit-transition errors is the same as the encoded bit pattern and may be referred to as the error corrected bit pattern. The bits at the diagonal positions, corresponding to the positions of the error correction parity bits reserved during the transformation step, are removed from the error corrected bit pattern. Each of the appended sub-arrays in the error corrected bit pattern, starting from the last appended sub-array, is decoded to obtain bits for the empty diagonal positions that are a part of the respective previous appended sub-array in the error corrected bit pattern and the balancing termination indices for the respective previous appended sub-array. With iterations of this process, the intermediate binary array is obtained. The first sub-array in the obtained intermediate binary array is subsequently decoded, in a reverse order as that followed for the encoding, to obtain the input data in original form.

With the encoding of the input data in accordance with the present subject matter, the number of 1's in each row and each column of the encoded binary array may be limited to about $½^t$ of the number of columns and rows, respectively, in the encoded binary array. For example, the number of 1's in each row and each column may be limited to about ½, about ¼, about ⅛, and so on, times the number of columns and rows, respectively, where the number of rows and columns are also an integer multiple of $2^t$. Thus, by storing such an encoded binary array in the memory array, the number of memory devices in the low resistive state in each row and each column of the memory array may be limited to about $½^t$ times the number of columns and rows, respectively, in the memory array. As mentioned earlier, t is an integer. The value of t may be based on a degree to which the parasitic currents, due to the half-selected memory devices in the memory array, are to be controlled.

Further, with the encoding of the input data in accordance with the present subject matter, the error correction parity bits may be encoded in the encoded bit pattern without introducing additional redundancy due to the error correction parity bits, beyond the reserved diagonal positions.

The methods and systems of the present subject matter are further described with reference to FIGS. 1 to 6. It should be noted that the description and figures merely illustrate the principles of the present subject matter. It is thus understood that various arrangements may be devised that, although not explicitly described or shown herein, embody the principles of the present subject matter. Moreover, all statements herein reciting principles, aspects, and examples of the present subject matter, as well as specific examples thereof, are intended to encompass equivalents thereof.

Figure 1:
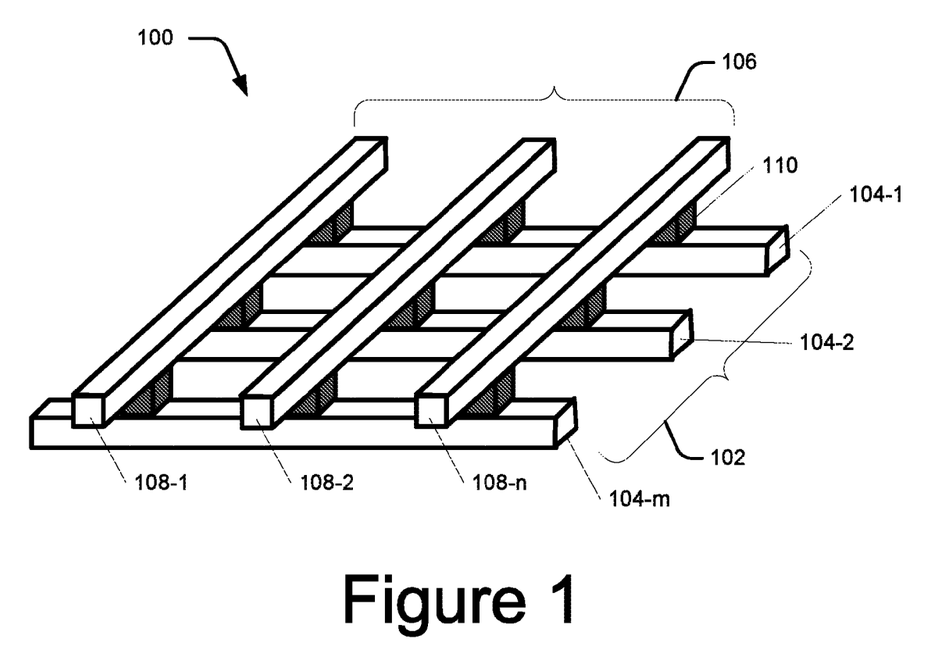
FIG. 1 illustrates a memristor-based memory array in a crossbar configuration, according to an example of the present subject matter.

FIG. 1 illustrates a memristor-based memory array 100 in a crossbar configuration, according to an example of the present subject matter. For the sake of simplicity, the memristor-based memory array 100 may interchangeably be referred to as the memory array 100. The memory array 100, as shown, is an m×n memory array formed by two sets of substantially parallel nanowires in the crossbar configuration. A first set 102 of m number of substantially parallel nanowires 104-1, 104-2, . . . , 104-m are positioned at about 90° to a second set 106 of n number of substantially parallel nanowires 108-1, 108-2, . . . , 108-n. The region at the intersection between each of the nanowires 104-1, 104-2, . . . , 104-m of the first set 102 and each of the nanowires 108-1, 108-2, . . . , 108-n of the second set 106 is disposed with a memristor 110 to form a 2-dimensional (2D) matrix of memristors. The 2D matrix of memristors arranged in m rows and n columns provide m×n distinct storage locations in the memory array 100. Each memristor 110 in the memory array 100 is between a distinct pair of nanowires, one from the first set 102 and the other from the second set 106. Thus, each memristor 110 can be uniquely addressed and selected based on the corresponding pair of nanowires from the first set 102 and the second set 106. It may be noted that the memory array 100 in FIG. 1 is an example illustration of m×n memristor-based memory array 100 for the purpose of description of the present subject matter and is by no means restricted to the illustrated example. Other configurations of the memory array with multiple memristors are also possible.

Figure 2A:
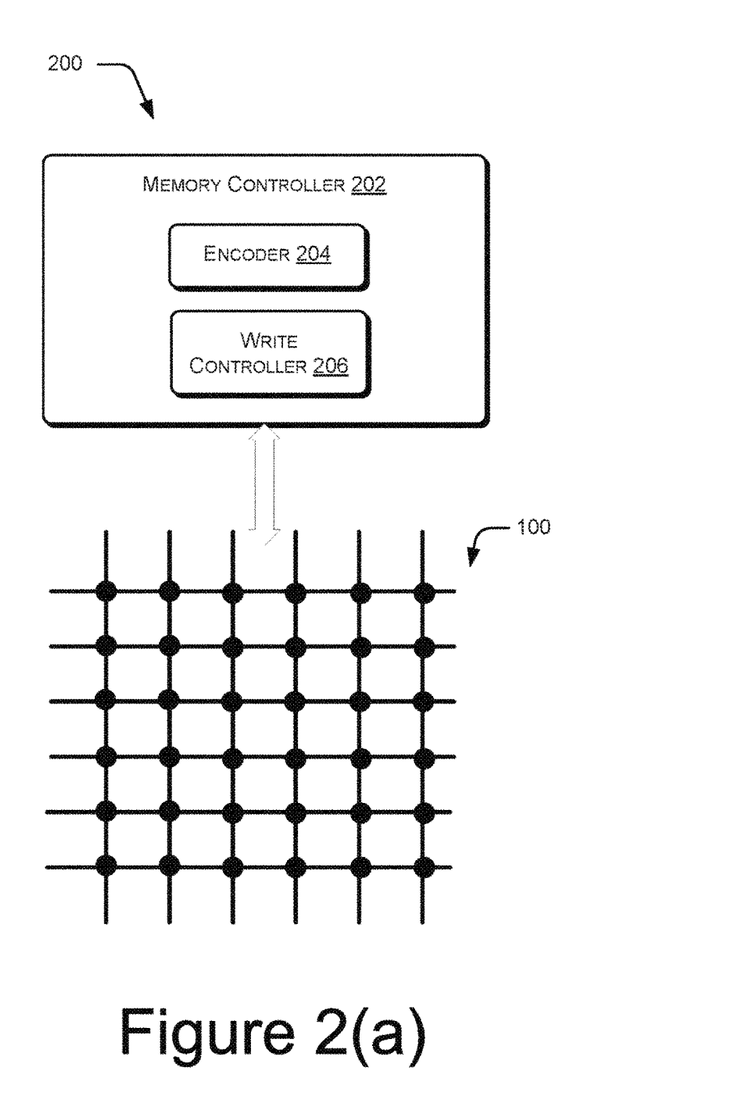

FIG. 2(a) illustrates a data storage system 200, according to an example of the present subject matter. The data storage system 200 includes the memristor-based memory array 100 having memristors in a crossbar configuration of m rows and n columns. The data storage system 200 is configured to store data into the memory array 100 in accordance with the present subject matter, such that the number of memristors in the low resistive state in each row and each column of the memory array 100 may be limited, and bit-transition errors that may occur during the writing and the reading of data in the memory array 100 may be detected and corrected.

The data storage system 200 includes a memory controller 202, coupled to the memory array 100, for controlling data storage in the memory array 100. The memory controller 202 includes an encoder 204 and a write controller 206. In an example implementation, the encoder 204 receives an input data and encodes the input data for storage in the memory array 100, and the write controller 206 stores or writes the encoded data into the memory array 100. The procedure of encoding, followed by the encoder 204, is described in detail later in the description.

Figure 2B:
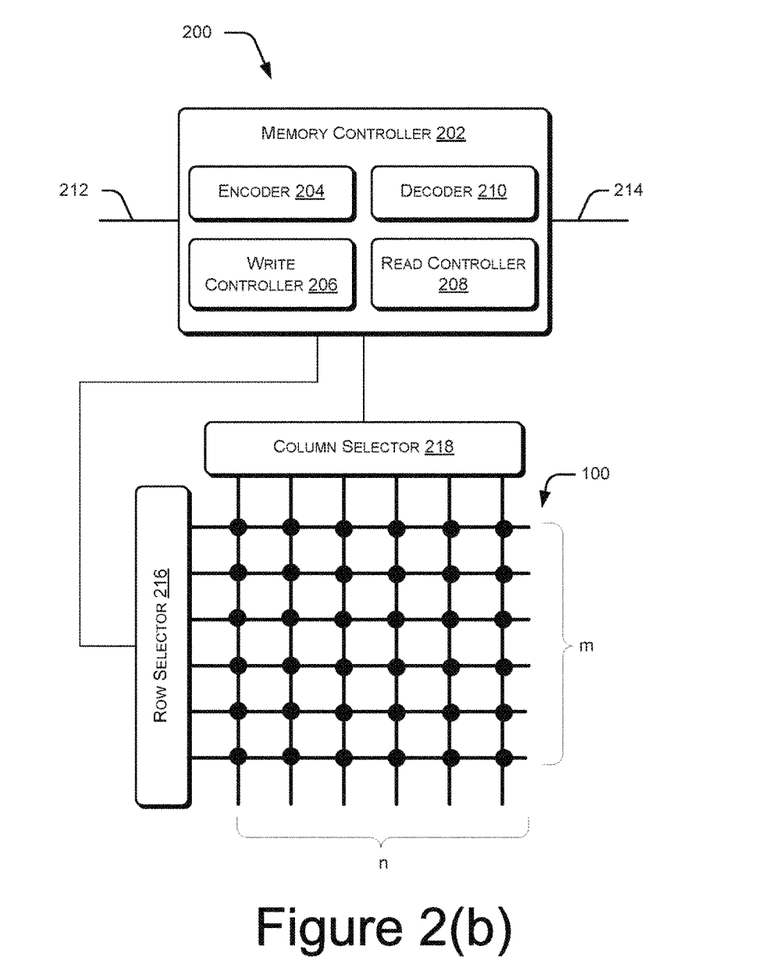

FIG. 2(b) illustrates the data storage system 200, according to an example of the present subject matter. As shown, apart from the encoder 204 and the write controller 206, the memory controller 202 includes a read controller 208 and a decoder 210. In an example implementation, the read controller 208 reads the memristors in the memory array 100 for retrieving the encoded data from the memory array 100, and the decoder 210 decodes the retrieved encoded data in order to obtain the input data in the original form. The encoder 204 may receive the input data from an input channel 212, and the decoder 210 may transmit the decoded input data to an output channel 214.

Further, as shown, the memory controller 202 is communicatively coupled to the memory array 100 through a row selector 216 and a column selector 218. The row selector 216 and the column selector 218 select a row from m rows and a column from n columns, respectively, for the purpose of writing of data into the corresponding memristor in the memory array 100 as communicated by the write controller 206. The row selector 216 and the column selector 218 also select a row and a column, respectively, for the purpose of reading of data from the corresponding memristor in the memory array 100 as communicated by the read controller 208.

In an example implementation, the encoder 204 receives the input data and encodes the input data to generate a 2D encoded bit pattern for storing in the m×n memory array 100 having memristors in m rows and n columns. The 2D encoded bit pattern is hereinafter referred to as the encoded bit pattern. The encoded bit pattern includes binary encoded data in m rows and n columns such that the number of 1's in each row of the encoded bit pattern is about a predefined fraction $\alpha$ of n, and the number of 1's in each column of the encoded bit pattern is about the predefined fraction $\alpha$ of m. Here, the predefined fraction $\alpha$ may be in the form of $\frac{1}{2^t}$, where t is an integer and m and n may be integer multiples of $2^t$ as well. Further, the encoded bit pattern also includes error correction parity bits that enable the detection and correction of bit-transition errors at the time of retrieval and decoding of the encoded bit pattern to obtain the input data in original form. For the purposes of the description hereinafter, the encoded bit pattern is denoted by 'E', and the error correction parity bits are denoted by 'P'.

The description below describes the generation of the encoded bit pattern E, from the input data, for storage in the memory array 100, according to an example implementation. In an example, let the number of columns n in the memory array 100 be equal to $2^k$, where k is an integer, and let the input data include $s_1$ input bits. To generate the encoded bit pattern E, the encoder 204 at first encodes the $s_1$ input bits into an intermediate binary array D having multiple sub-arrays B. For this, the encoder 204 iteratively generates a first sub-array $B_1$ and one or more subsequent sub-arrays $B_2$, $B_3$, . . . so on, and appends each sub-array row-wise to the intermediate binary array D after the each iteration, starting from a null intermediate binary array.

To generate the first sub-array $B_1$ in the first iteration, the encoder 204 distributes $s_1$ input bits into $m_1$ groups of b bits or less than b bits, such that $m_1$ is a smallest integer multiple of $1/\alpha$ that is no smaller than $s_1/b$. The value of $m_1$ depends on the value of $s_1$. After distributing the $s_1$ input bits, if the value of $m_1$ is more than $1/\alpha$, the encoder 204 codes each of the $m_1$ groups of bits into a respective binary vector, such that the respective binary vector is of length n and has $\alpha \times n$ 1's. In an example implementation, a group of b bits or less than b bits may be coded using exact enumerative coding or approximate enumerative coding, where b is the number of bits the respective enumerative coding can encode in a length n binary vector with $\alpha \times n$ 1's. After coding the $m_1$ groups of bits, the encoder 204 arranges the binary vectors, based on the coding, row-wise to form an $m_1 \times n$ array. After this, the encoder 204 performs a column balance coding on the $m_1 \times n$ array to obtain the first sub-array $B_1$, such that the columns of the first sub-array $B_1$ have an equal number of 1's.

The description below describes the column balance coding for an array with n columns, where $n=2^k$ for an integer k, according to an example implementation. The procedure described herein may be used by the encoder 204 to perform column balance coding to an array of n columns, for $n=2^k$. In the column balance coding, the array of n columns is iteratively modified k times. In the $i^{th}$ iteration, where i=1 to k, the columns of the array are partitioned into $2^i$ contiguous column groups with each column group having equal number of columns. Then, each two adjacent column groups, from the $2^i$ contiguous column groups, are paired to form $2^{i-1}$ disjoint pairs of column groups. Then, for each of the disjoint pairs of column groups, $j^{th}$ bit in one column group of the respective pair is switched with $j^{th}$ bit in other column group of the respective pair until both the column groups of the respective pair have equal number of 1's.

To illustrate the column balance coding with the example, consider a case where the array has 4 rows and 8 columns. With $n=8=2^3$, k is 3. Thus, the array is modified 3 times in the column balance coding. In the first iteration, i=1, the array is partitioned into 2 column groups, with the first column group having the first four columns and the second column group having the last four columns. The two column groups are paired to form a single disjoint pair of column groups. The number of 1's in the respective column groups of the pair are compared, and if the number of 1's in the respective column groups are not equal, then, for increasing value of j, the $j^{th}$ bit in one column group of the pair is switched with the $j^{th}$ bit in the other column group of the pair, until the number of 1's in both the column groups of the pair are equal. After this, in the second iteration, i=2, the array after the first iteration is partitioned into 4 column groups, with the first column group having the first two columns, the second column group having the third and fourth columns, the third column group having the fifth and sixth columns, and the fourth column group having the last two columns. The two adjacent column groups are paired to form two disjoint pairs of column groups. For each disjoint pair, the number of 1's in respective column groups of the respective pair are compared, and if not equal, then for increasing value of j, the $j^{th}$ bit in one column group of the respective pair is switched with the $j^{th}$ bit in the other column group of the respective pair, until the number of 1's in both the column groups of the respective pair is equal. After this, in the third iteration, i=3, the array after the second iteration is partitioned into 8 columns groups, with each column group having a single column. Again the adjacent column groups are paired to form four disjoint pairs of column groups. The process of comparing the number of 1's in the column groups in a disjoint pair and switching the bits until the number of 1's in both the columns groups of the disjoint pair, as described above, is repeated for each of the disjoint pairs.

After generating the first sub-array $B_1$, the encoder 204 appends the first sub-array $B_1$ to the intermediate binary array D, where the intermediate binary array D is initially a null array. Thus, after the first iteration, the intermediate binary array D is an $m_1 \times n$ array.

Further, the encoder 204 obtains a set of $s_2$ bits based on the generation of the first sub-array $B_1$ and the intermediate binary array D. The encoder 204 then generates a subsequent sub-array, i.e., the second sub-array $B_2$, based on the set of $s_2$ bits. To obtain the set of $s_2$ bits, the encoder 204 determines a balancing termination index for column balancing of each disjoint pair of column groups and for each of the k iterations during the column balance coding to generate the first sub-array $B_1$. A balancing termination index for column balancing of a disjoint pair is indicative of the position of the $j^{th}$ bit in a column group of the disjoint pair at which the switching terminates. In an example, the encoder 204 codes each balancing termination index into a binary vector, and concatenates the binary vectors, corresponding to the balancing termination indices for the k iterations. After this, the encoder 204 appends the diagonal bits of the intermediate binary array D, obtained after the appending of the first sub-array $B_1$, to the concatenated binary vectors to obtain the set of $s_2$ bits.

To illustrate the determining of balancing termination indices for k iterations and coding each of the balancing termination indices into a respective binary vector, consider the above described example of column balance coding of the array of 4 rows and 8 columns. For said example k is 3. In the first iteration, there are 2 column groups, each having 4 columns and 16 bits, and there is 1 disjoint pair. The balancing termination index is the position of the bit switch at which the number of 1's in the two column groups of the disjoint pair become equal. The positions of 16 bits can be represented through 4 bits. It may be noted that the position of the last bit cannot be the position of last switch, as it will correspond to complete swapping of the two column groups. If the number of 1's in the two column groups are not equal to begin with, the complete swapping of the two column groups cannot make the number of 1's equal. Thus, the possible balancing termination indices are from positions of bits 1 to 15, which can be represented as from 0001 to 1111. If the encoder 204 determines the balancing termination index from 1 to 15, then the encoder 204 codes the balancing termination index into a binary vector with a corresponding combination of 4 bits, from 0001 to 1111.

It may be noted that one possibility is that no switching is performed as both the column groups have equal number of 1's. In such a case, the encoder 204 determines the balancing termination index as null and codes the null balancing termination index into a binary vector as 0000. Now, in the second iteration, there are 4 column groups, each having 2 columns and 8 bits, and there are 2 disjoint pairs. Thus, from the second iteration, the encoder 204 determines two balancing termination indices. Based on the above description for coding, the encoder 204 codes each of the two balancing termination indices into a respective binary vector with a combination of 3 bits from 001 to 111 when the balancing termination index is from 1 to 7, or into a respective binary vector as 000 when the balancing termination index is null. The procedure described above is repeated for the third iteration, in which there are 8 column groups, each having 1 column and 4 bits, and there are four disjoint pairs. From the third iteration, the encoder 204 determines four balancing termination indices. Based on the above description for coding, the encoder 204 codes each of the four balancing termination indices into a respective binary vector with a combination of 2 bits from 01 to 11 when the balancing termination index is from 1 to 3, or into a respective binary vector as 00 when the balancing termination index is null.

For the example described above, the encoder 204 concatenates the binary vectors from all the iterations to obtain a set of $4+2\times3+4\times2=18$ bits. To this set, the encoder 204 appends the diagonal bits of the intermediate binary array D obtained after the row-wise appending of the previous sub-array to obtain the set of $s_i$ bits to be used for the generation of the subsequent sub-array $B_i$.

Now, to generate the second sub-array $B_2$ from the set of $s_2$ bits in the second iteration, the encoder 204 distributes the set of $s_2$ bits into $m_2$ groups of b bits or less than b bits, such that $m_2$ is a smallest integer multiple of $1/\alpha$ and no smaller than $s_2/b$. The value of $m_2$ depends on the value of $s_2$. If the value of $m_2$ is more than $1/\alpha$, the encoder 204 codes each of the $m_2$ groups of bits into a respective binary vector, such that the respective binary vector is of length n and has $\alpha \times n$ 1's. In an example implementation, each group of b bits or less than b bits may be coded using exact enumerative coding or approximate enumerative coding, as mentioned earlier. After coding the $m_2$ groups of bits, the encoder 204 arranges the binary vectors, based on the coding, row-wise to form an $m_2 \times n$ array. After this, the encoder 204 performs a column balance coding on the $m_2 \times n$ array to obtain the second sub-array $B_2$, such that the columns of the second sub-array $B_2$ have an equal number of 1's. The column balance coding can be performed in a manner as described earlier in the description.

After generating the second sub-array $B_2$, the encoder 204 appends the second sub-array $B_2$ to the intermediate binary array D. Thus, after the first iteration, the intermediate binary array D is an $(m_1+m_2) \times n$ array.

After this, the encoder 204 repeats the above described steps iteratively to obtain subsequent sets of bits including a set of $s_3$ bits, a set of $s_4$ bits, . . . , a set of $s_Q$ bits, generate subsequent sub-arrays including a third sub-array $B_3$ with $m_3$ rows and n columns, a fourth sub-array $B_4$ with $m_4$ rows and n columns, . . . , a $Q^{th}$ sub-array $B_Q$ with $m_Q$ rows and n columns, and append each of the subsequent sub-arrays $B_3, B_4, \ldots, B_Q$ to the intermediate binary array D. Each subsequent set of $s_i$ bits is obtained based on coding of balancing termination indices for a previous sub-array $B_{i-1}$ and based on appending of diagonal bits of the intermediate binary array D that are a part of the previous sub-array $B_{i-1}$ after it is row-wise appended to the intermediate binary array D. Each subsequent sub-array $B_i$ is obtained by encoding the set of $s_1$ bits such that the number of 1's in each row of the subsequent sub-array $B_i$ is equal to $\alpha \times n$ and by performing the column balance coding as described above. After the $Q^{th}$ iteration, the intermediate binary array D is an $(m_1+m_2+\ldots+m_Q) \times n$ array. The encoding process iterations are terminated at the $Q+1^{th}$ iteration when the value of $m_{Q+1}$, determined based on the set of $s_{Q+1}$ bits as the smallest integer multiple of $1/\alpha$ that is no smaller than $s_{Q+1}/b$, is less than or equal to $1/\alpha$. In the $Q+1^{th}$ iteration, the encoder 204 generates the last sub-array $B_{Q+1}$, as described below. The set of $s_{Q+1}$ bits are obtained in a similar manner as described for obtaining the set of $s_i$ bits.

In an example implementation of the encoding process termination, to generate the last sub-array $B_{Q+1}$ from the set of $s_{Q+1}$ bits in the $Q+1^{th}$ iteration, the encoder 204 distributes the set of $s_{Q+1}$ bits into $m_{Q+1}$ groups of b bits or less than b bits. The encoder 204 codes each of the $m_{Q+1}$ groups of bits into a respective binary vector, such that the respective binary vector is of length n and has $\alpha \times n$ 1's. In an example implementation, a group of b bits or less than b bits may be coded using exact enumerative coding or approximate enumerative coding, as mentioned earlier. After coding the $m_{Q+1}$ groups of bits, the encoder 204 arranges the binary vectors, based on the coding, row-wise to form the last sub-array $B_{Q+1}$ of $m_{Q+1}$ n rows and n columns. After generating the last sub-array $B_{Q+1}$, the encoder 204 appends the last sub-array $B_{Q+1}$ row-wise to the intermediate binary array D. With this, after the $Q+1^{th}$ iteration, the intermediate binary array D is an $(m_1+m_2+\ldots+m_Q+m_{Q+1}) \times n$ array.

In an example implementation of the encoding process termination, the encoder 204 codes the set of $s_{Q+1}$ bits into $1/\alpha \times 1/\alpha$ permutation matrices, and appends the permutation matrices row-wise to the intermediate binary array D. Suppose M rows are added to the intermediate binary array D upon appending the permutation matrices. With this, after the $Q+1^{th}$ iteration, the intermediate binary array D is an $(m_1+m_2+\ldots+m_Q+M) \times n$ array.

After performing the $Q+1^{th}$ iteration as described above, the encoder 204 transforms the intermediate binary array D to the encoded bit pattern E with the error correction parity bits P. For this, in an example implementation, the encoder 204 reserves the diagonal positions in the intermediate binary array D, except for the positions due to the last appended sub-array from $Q+1^{th}$ iteration, for the error correction parity bits P. The encoder 204 may then arrange the bits in the non-reserved positions in the intermediate binary array D in a vector s', and encode the vector s' through a predefined encoding process to compute the error correction parity bits P. In an example implementation, the predefined encoding process may be linear block encoding process, as described later in the description. After this, the encoder 204 inserts the error correction parity bits P in the reserved diagonal positions in the intermediate binary array D to obtain the encoded bit pattern E.

The description below describes the linear block encoding process for computing the error correction parity bits P for the purposes of the present subject matter. Let the vector s' be of length h. Linear block encoding technique encodes the vector s' of length h by considering the vector s' to be a vector $\mu$ in a h-dimensional vector space, and multiplying over the binary field (equivalently, modulo 2) the vector p by a generator matrix, as follows:

$$c = \mu \cdot G. \qquad (1)$$

Notationally expanding the symbols in the above equation produces either of the following alternative expressions:

$$(c_0, c_1, \ldots, c_{v-1}) = (\mu_0, \mu_1, \ldots, \mu_{h-1}) \begin{pmatrix} g_{00} & \cdots & g_{0,v-1} \\ \vdots & \ddots & \vdots \\ g_{k-1,0} & \cdots & g_{h-1,v-1} \end{pmatrix} \qquad (2)$$

or, $$(c_0, c_1, \ldots, c_{v-1}) = (\mu_0, \mu_1, \ldots, \mu_{h-1}) \begin{pmatrix} g_0 \\ g_1 \\ \vdots \\ \vdots \\ g_{h-1} \end{pmatrix} \qquad (3)$$

where $g_i = (g_{i,0}, g_{i,1}, \ldots, g_{i,v-1})$.

The generator matrix G for a linear block code can have the form:

$$G_{h,v} = \begin{pmatrix} p_{0,0} & \cdots & p_{0,r-1} & 1 & \cdots & 0 \\ \vdots & \ddots & \vdots & \vdots & \ddots & \vdots \\ p_{h-1,0} & \cdots & p_{h-1,r-1} & 0 & \cdots & 1 \end{pmatrix} \qquad (4)$$

or, alternatively:

$$G_{h,v} = [P_{h,r} | I_{h,h}] \qquad (5)$$

Thus, the generator matrix C can be placed into a form of a matrix P augmented with a h by h identity matrix $I_{h,h}$. Alternatively, the generator matrix G can have the form:

$$G_{h,v} = [I_{h,h} | P_{h,r}] \qquad (6)$$

A code generated by a generator matrix in this form is referred to as a "systematic code." When a generator matrix having the first form, above, is applied to a vector $\mu$, the resulting codeword c has the form:

$$c = (c_0, c_1, \ldots, c_{r-1}, \mu_0, \mu_1, \ldots, \mu_{h-1}) \qquad (7)$$

where $c_i = (\mu_0 p_{0,i} + \mu_1 p_{1,i}, \ldots, +\mu_{h-1} p_{h-1,i})$ over the binary field. Using a generator matrix of the second form, the resulting codeword c is generated with trailing parity-check bits. Thus, in a systematic linear block code, the codewords comprise r parity-check symbols $c_i$ followed by the h symbols comprising the original vector p or the h symbols comprising the original vector $\mu$ followed by r parity-check symbols. When no errors arise, the original word, or vector $\mu$, occurs in clear-text form within, and is easily extracted from, the corresponding codeword. The parity-check symbols turn out to be linear combinations of the symbols of the original word, or the vector $\mu$. The parity-check bits obtained through the above process are the error correction parity bits P.

Figure 3A:
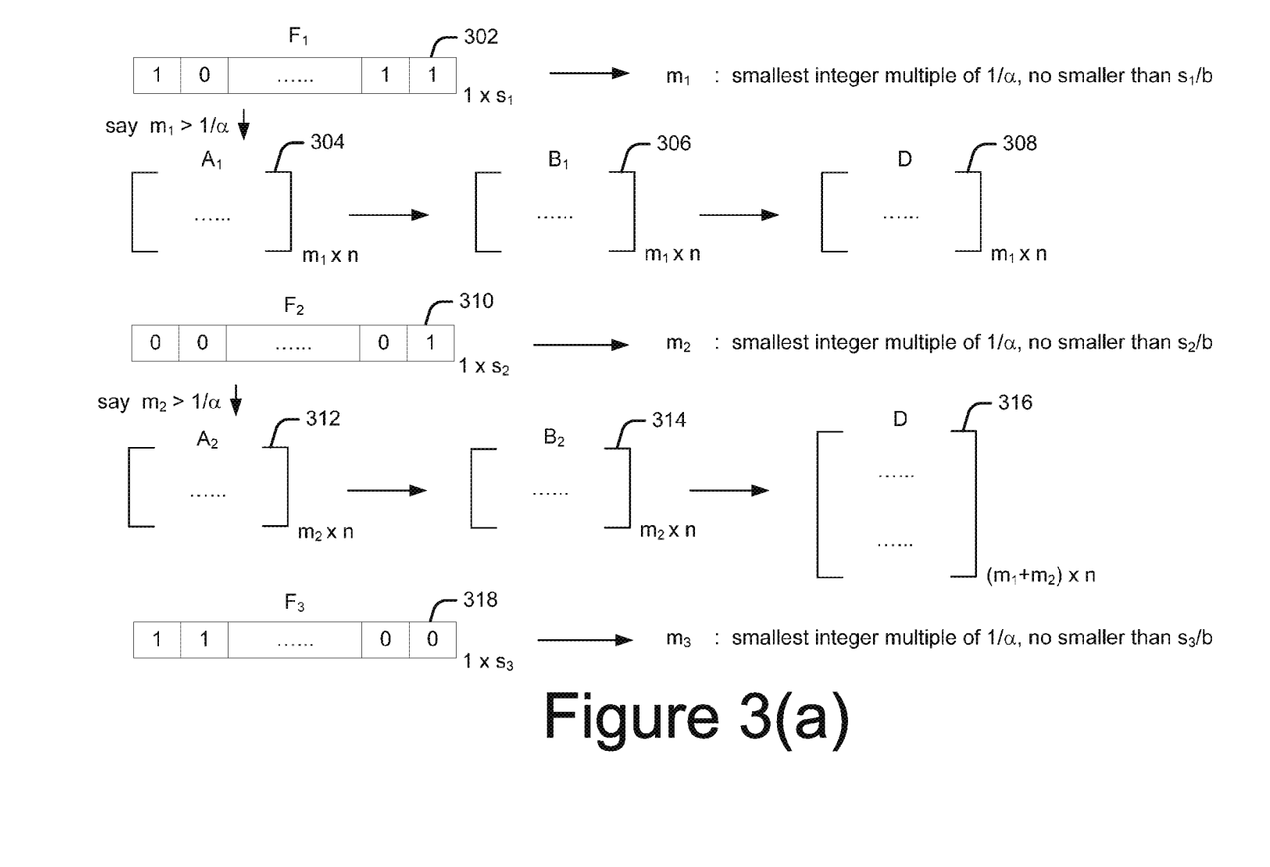
Figure 3B:
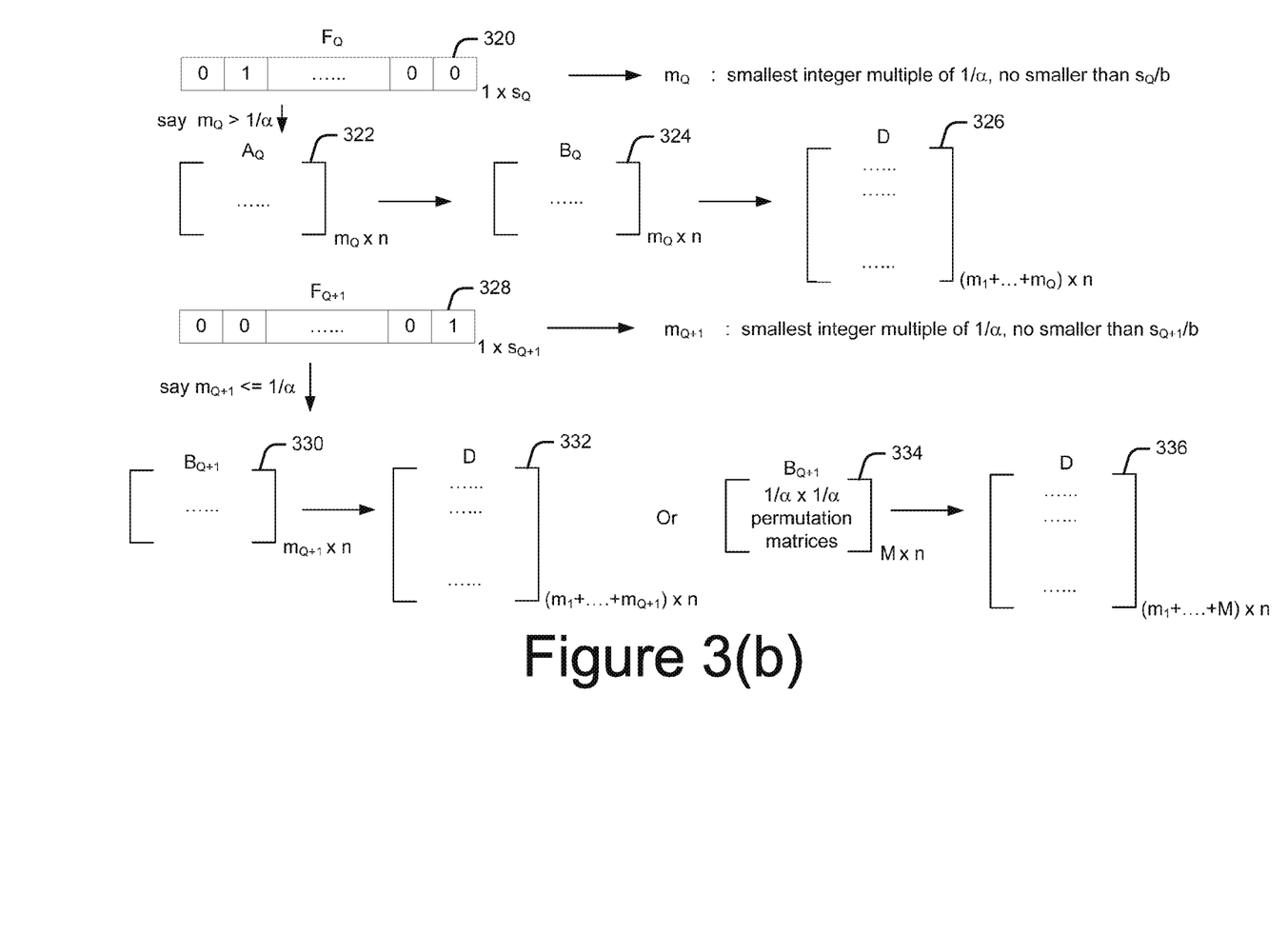

FIGS. 3(a) and 3(b) show an illustrative example of generating an intermediate binary array D by encoding an input data of $s_1$ input bits, as described above. Referring to FIG. 3(a), a set $F_1$ of $s_1$ input bits is referenced by 302. In the first iteration, based on the value of $s_1$, a value of $m_1$ is determined for distributing the $s_1$ input bits into $m_1$ groups of b bits or less than b bits, such that $m_1$ is the smallest integer multiple of $1/\alpha$ and no smaller than $s_1/b$. Lets say the value of $m_1$ is more than $1/\alpha$. Based on the value of $m_1$ and distribution of $s_1$ input bits into $m_1$ groups, an $m_1 \times n$ array $A_1$ is generated such that each row of the array $A_1$ has $\alpha \times n$ 1's. The array $A_1$ is generated based on the procedure described earlier in the description. The array $A_1$ is referenced by 304. From the array $A_1$, a first sub-array $B_1$ is generated by performing column balance coding on the array $A_1$. The first sub-array $B_1$ is referenced by 306. Let the intermediate binary array D be a null array. The first sub-array $B_1$ is appended row-wise to the null intermediate binary array D. The intermediate binary array D after appending the first sub-array $B_1$ thus has $m_1$ rows and n columns, and is referenced by 308.

Further, based on the balancing termination indices for the first sub-array $B_1$ and the diagonal bits of the intermediate binary array D referenced by 308, a set $F_2$ of $s_2$ bits is obtained. The set $F_2$ of $s_2$ bits is referenced by 310.

In the second iteration, based on the value of $s_2$, a value of $m_2$ is determined for distributing the $s_2$ bits into $m_2$ groups of b bits or less than b bits, such that $m_2$ is a smallest integer multiple of $1/\alpha$ that is no smaller than $s_2/b$. Lets say the value of $m_2$ is more than $1/\alpha$. Based on the value of $m_2$ and distribution of $s_2$ bits into $m_2$ groups, an $m_2 \times n$ array $A_2$ is generated such that each row of the array $A_2$ has $\alpha \times n$ 1's. The array $A_2$ is generated based on the procedure described earlier in the description. The array $A_2$ is referenced by 312. From the array $A_2$, a second sub-array $B_2$ is generated by performing column balance coding as on the array $A_2$. The second sub-array $B_2$ is referenced by 314. The second sub-array $B_2$ is appended row-wise to the intermediate binary array D referenced by 308. The intermediate binary array D after appending the second sub-array $B_2$ thus has $m_1+m_2$ rows and n columns, and is referenced by 316.

After this, based on the balancing termination indices for the second sub-array $B_2$ and the diagonal bits of the intermediate binary array D, referenced by 316, that are a part of the second sub-array $B_2$ (i.e. the rows which are appended as the second binary array $B_2$), a set $F_3$ of $s_3$ bits is obtained. The set $F_3$ of $s_3$ bits is referenced by 318.

In the third iteration, based on the value of $s_3$, a value of $m_3$ is determined for distributing the $s_3$ bits into $m_3$ groups of b bits or less than b bits, such that $m_3$ is a smallest integer multiple of $1/\alpha$ that is no smaller than $s_3/b$. Lets say the value of $m_3$ is more than $1/\alpha$. Based on the value of $m_3$, the above described procedure for generating the second sub-array $B_2$ from the $s_2$ bits is repeated to determine a third sub-array $B_3$ (not shown in FIG. 3(*a*)). The third sub-array $B_3$ is appended to the intermediate binary array D.

The above described procedure of obtaining a set of $s_i$ bits based on the previous iteration and for the subsequent iteration, generating a subsequent sub-array $B_i$ with $m_i$ rows and n column when the value of $m_i$ is more than $1/\alpha$, and appending the subsequent sub-array $B_i$ to the intermediate binary array D, is iteratively repeated.

Referring to FIG. 3(*b*), lets say a set $F_Q$ of $s_Q$ bits is obtained based on the balancing termination indices for the sub-array $B_{Q-1}$ and the diagonal bits of the intermediate binary array D that are a part of the previous appended sub-array $B_{Q-1}$. The set $F_Q$ of $s_Q$ bits is referenced by 320, which is used for the $Q^{th}$ iteration.

In the $Q^{th}$ iteration, based on the value of $s_Q$, a value of $m_Q$ is determined for distributing the so bits into $m_Q$ groups of b bits or less than b bits, such that ma is a smallest integer multiple of $1/\alpha$ that is no smaller than $s_Q/b$. Lets say the value of $m_Q$ is more than $1/\alpha$. Based on the value of $m_Q$ and distribution of $s_Q$ bits into $m_Q$ groups, an $m_Q \times n$ array $A_Q$ is generated such that each row of the array $A_Q$ has $\alpha \times n$ 1's. The array $A_Q$ is generated based on the procedure described earlier in the description. The array $A_Q$ is referenced by 322. From the array $A_Q$, a sub-array $B_Q$ is generated by performing column balance coding as on the array $A_Q$. The sub-array $B_Q$ is referenced by 324. The sub-array $B_Q$ is appended row-wise to the intermediate binary array D from the previous iteration. The intermediate binary array D after appending the sub-array $B_Q$ thus has $(m_1+m_2+m_3+\ldots+m_Q)$ rows and n columns, and is referenced by 326.

Further, based on the balancing termination indices for the sub-array $B_Q$ and the diagonal bits of the intermediate binary array D, referenced by 326, that are a part of the appended sub-array $B_Q$, a set $F_{Q+1}$ of $s_{Q+1}$ bits is obtained. The set $F_{Q+1}$ of $s_{Q+1}$ bits is referenced by 328.

In the $Q+1^{th}$ iteration, based on the value of $s_{Q+1}$ a value of $m_{Q+1}$ is determined for distributing the $s_{Q+1}$ bits into $m_{Q+1}$ groups of b bits or less than b bits, such that $m_{Q+1}$ is a smallest integer multiple of $1/\alpha$ that is no smaller than $s_{Q+1}/b$. The $Q+1^{th}$ iteration is the first iteration for which the value of $m_{Q+1}$ is less than or equal to $1/\alpha$, and the encoding process is terminated in this iteration.

In an example implementation of the encoding process termination, the $s_{Q+1}$ bits are distributed into $m_{Q+1}$ groups, and the last sub-array $B_{Q+1}$ of $m_{Q+1}$ rows and n columns is generated such that each row of the last sub-array $B_{Q+1}$ has $\alpha \times n$ 1's. The sub-array $B_{Q+1}$ is generated based on the procedure described earlier in the description. The sub-array $B_{Q+1}$ is referenced by 330. The sub-array $B_{Q+1}$ is appended row-wise to the intermediate binary array D referenced by 326. The intermediate binary array D after appending the sub-array $B_{Q+1}$ thus has $(m_1+m_2+\ldots+m_Q+m_{Q+1})$ rows and n columns, and is referenced by 332. The intermediate binary array D referenced 332 is transformed to generate a 2D encoded bit pattern E with the error correction parity bits P, for storing in the memory array 100.

In another example implementation of the encoding process termination, the $s_{Q+1}$ bits are encoded into $1/\alpha \times 1/\alpha$ permutation matrices referenced by 334. The permutation matrices are appended row-wise to the intermediate binary array D referenced by 326. Let the permutation matrices contribute M rows in the intermediate binary array D. The intermediate binary array D after appending the permutation matrices thus has $(m_1+m_2+\ldots+m_Q+M)$ rows and n columns, and is referenced by 336. The intermediate binary array D referenced 336 is transformed to generate a 2D encoded bit pattern E with the error correction parity bits P, for storing in the memory array 100.

Figure 4:
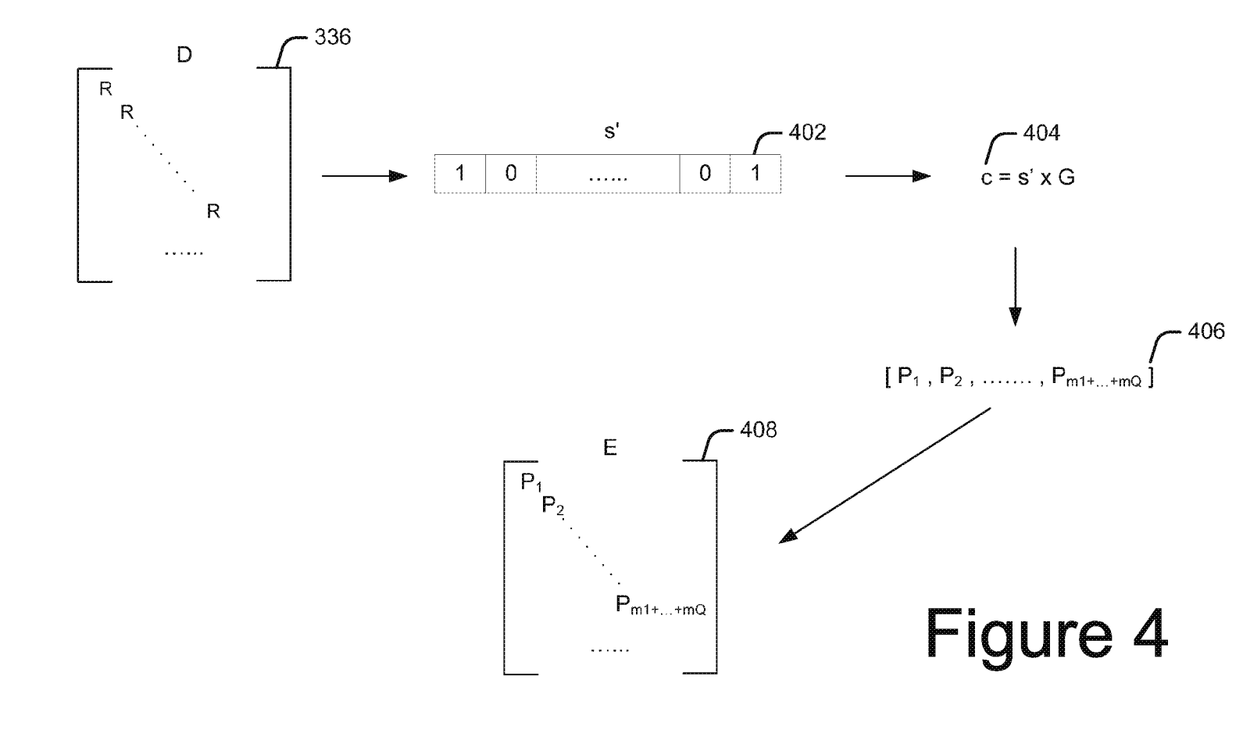
FIG. 4 shows transformation of an intermediate binary array into a 2D encoded bit pattern with error correction parity bits, according to an example of the present subject matter.

FIG. 4 shows an illustrative example of transforming an intermediate binary array D into a 2D encoded bit pattern E with error correction parity bits P, as described above. Let the intermediate binary array D be the one referenced by 336 in FIG. 3(*b*). Referring to FIG. 4, the diagonal positions in the intermediate binary array D, except for the positions due to the last appended sub-array from $Q+1^{th}$ iteration, are reserved for the error correction parity bits P. The reserved positions are marked by "R" in the intermediate binary array D referenced by 336 in FIG. 4. The bits in the non-reserved positions in the intermediate binary array D are arranged in a vector s', referenced by 402. The vector s' is multiplied by a generator matrix G of the linear block encoding process to obtain a codeword c. The codeword c is referenced by 404. From the codeword c the values of $(m_1+\ldots+m_Q)$ number of error correction parity bits P are obtained. Let the error correction parity bits P be $P_1, P_2, \ldots, P_{m_1+\ldots+m_Q}$, referenced by 406. The error correction parity bits P are inserted in the reserved diagonal positions R in the intermediate binary array D to obtain the encoded bit pattern E, referenced by 408.

After generating the encoded bit pattern E, in an example implementation, the write controller 206 stores the encoded bit pattern E into the memristors in the m×n memory array 100. It may be noted that the value of m is $(m_1+m_2+ \ldots m_Q+m_{Q+1})$ or $(m_1+m_2+ \ldots m_Q+M)$, in accordance with the description herein. The encoded bit pattern E is stored such that the states of the memristors in the memory array 100 map the 0's and 1's in the encoded bit pattern E. With this, the number of memristors in each row and each column of the memory array 100 having a low resistive state is about α×n and α×m, respectively.

Further, in an example implementation, the read controller 208 reads the memristors in the memory array 100 to retrieved a bit patter, and the decoder 210 decodes the retrieved bit pattern to obtain the input data with $s_1$ input bits in the original form.

The description below describes the process of obtaining the input data having $s_1$ input bits by decoding the bit pattern, retrieved from the m×n memory array 100, according to an example implementation. For the purposes of the description herein, the retrieved bit pattern is denoted by 'T'. The decoder 210 may receive the retrieved bit pattern T with one or more bit-transition errors. The decoder 210 at first produces a vector s" from the retrieved bit pattern T, by reversing the mapping by which the codeword 404 is mapped into the encoded bit pattern E. With reference to the linear block encoding process followed for generation of the error correction parity bits P, the decoder 210 multiplies, over the binary field, the vector s" with the transpose of a parity-check matrix to produce a syndrome S. The parity-check matrix is denoted by $H_{r,v}$ and is defined as:

$$H_{r,v}=[I_{r,r}|-P^T] \quad (8)$$

or equivalently, $$H_{r,v} = \begin{pmatrix} 1 & \cdots & 0 & -p_{0,0} & \cdots & -p_{h-1,0} \\ \vdots & \ddots & \vdots & \vdots & \ddots & \vdots \\ 0 & \cdots & 1 & -p_{0,r-1} & \cdots & -p_{h-1,r-1} \end{pmatrix} \quad (9)$$

The syndrome S is $$S=(S_0, S_1, \ldots, S_{r-1}) s'' \times H^T \quad (10)$$

where $H^T$ is the transpose of the parity-check matrix $H_{r,v}$ represented as:

$$H^T = \begin{pmatrix} 1 & \cdots & 0 \\ \vdots & \ddots & \vdots \\ 0 & \cdots & 1 \\ -p_{0,0} & \cdots & -p_{0,r-1} \\ \vdots & \ddots & \vdots \\ -p_{h-1,0} & \cdots & -p_{h-1,r-1} \end{pmatrix} \quad (11)$$

It may be noted that when a binary field is employed, x=−x, so the minus signs shown above in $H^T$ are generally not shown.

The syndrome S is used for error detection and error correction. When the syndrome S is the all-0 vector, no errors are detected in the vector s" and the retrieved bit pattern T is the same as the encoded bit pattern E. When the syndrome S includes bits with value "1," errors are indicated. There are techniques for computing an estimated error vector ê from the syndrome S and the vector s" which, when added by modulo-2 addition to the vector s", generates a best estimate of the vector s' or the encoded bit pattern E.

Thus, based on the multiplication of the vector s" with the transpose of a parity-check matrix $H_{r,v}$, if the syndrome S has all-0 vector, the decoder 210 determines that the retrieved bit pattern T has no bit-transition errors. With this, the retrieved bit pattern T is likely to be the same as the encoded bit pattern E as generated by the encoder 204 for storing in the memory array 100. If the syndrome S includes bits with value "1", the decoder 210 computes the error vector ê from the syndrome S. The decoder 210 then adds the error vector ê by modulo-2 addition to the vector s" to correct the bit-transition errors in the retrieved bit pattern T and produce an error corrected bit pattern which is the same as the encoded bit pattern E. It may be noted that the error corrected bit pattern is a binary array that includes the row-wise appended sub-arrays $B_1, B_2, \ldots, B_Q, B_{Q+1}$, or having the row-wise appended sub-arrays $B_1, B_2, \ldots, B_Q$ and the permutation matrices, as described earlier in the description.

After this, the decoder 210 removes bits in the diagonal positions of the error corrected bit pattern, except for the bits in the diagonal positions due to the rows added from the $Q+1^{th}$ iteration. The decoder 210 then decodes the last appended sub-array, by reversing the steps followed by the encoder 204 for generating the last sub-array, to obtain bits for the empty diagonal positions that belong to the previous sub-array $B_Q$ and obtain the balance termination indices for this sub-array $B_Q$. The obtained diagonal bits are inserted in the empty diagonal positions that belong to the rows corresponding to the sub-array $B_Q$ in the error corrected bit pattern. With this, the sub-array $B_Q$, the same as that generated by the encoder 204, is obtained. The obtained balance termination indices are then used to reverse the column balance coding operations and thereby recover the sub-array $A_Q$. The rows of this sub-array $A_Q$ are then decoded, using the procedure followed by the encoder 204 for generating the sub-array $A_Q$, to obtain the set of $s_Q$ bits. The set of $s_Q$ bits is then parsed to obtain bits for the empty diagonal positions that belong to the rows corresponding to the previous sub-array $B_{Q1}$ in the error correction bit pattern and obtain bits for the balance termination indices for this sub-array $B_{Q-1}$. By iteratively repeating this process, the decoder 210 may decode each previous sub-array $B_i$ in the error corrected bit pattern till the first sub-array $B_1$ is obtained. As described, this is done by reversing the steps followed by the encoder 204 for generating each sub-array $B_i$ of the intermediate binary array D from the $s_1$ input bits. With this, the decoder 210 may obtain the intermediate binary array D which is the same as obtained by the encoder 204. The decoder 210, at the last, decodes the first sub-array $B_1$ to obtain the $s_1$ input bits of the input data.

Figure 5:
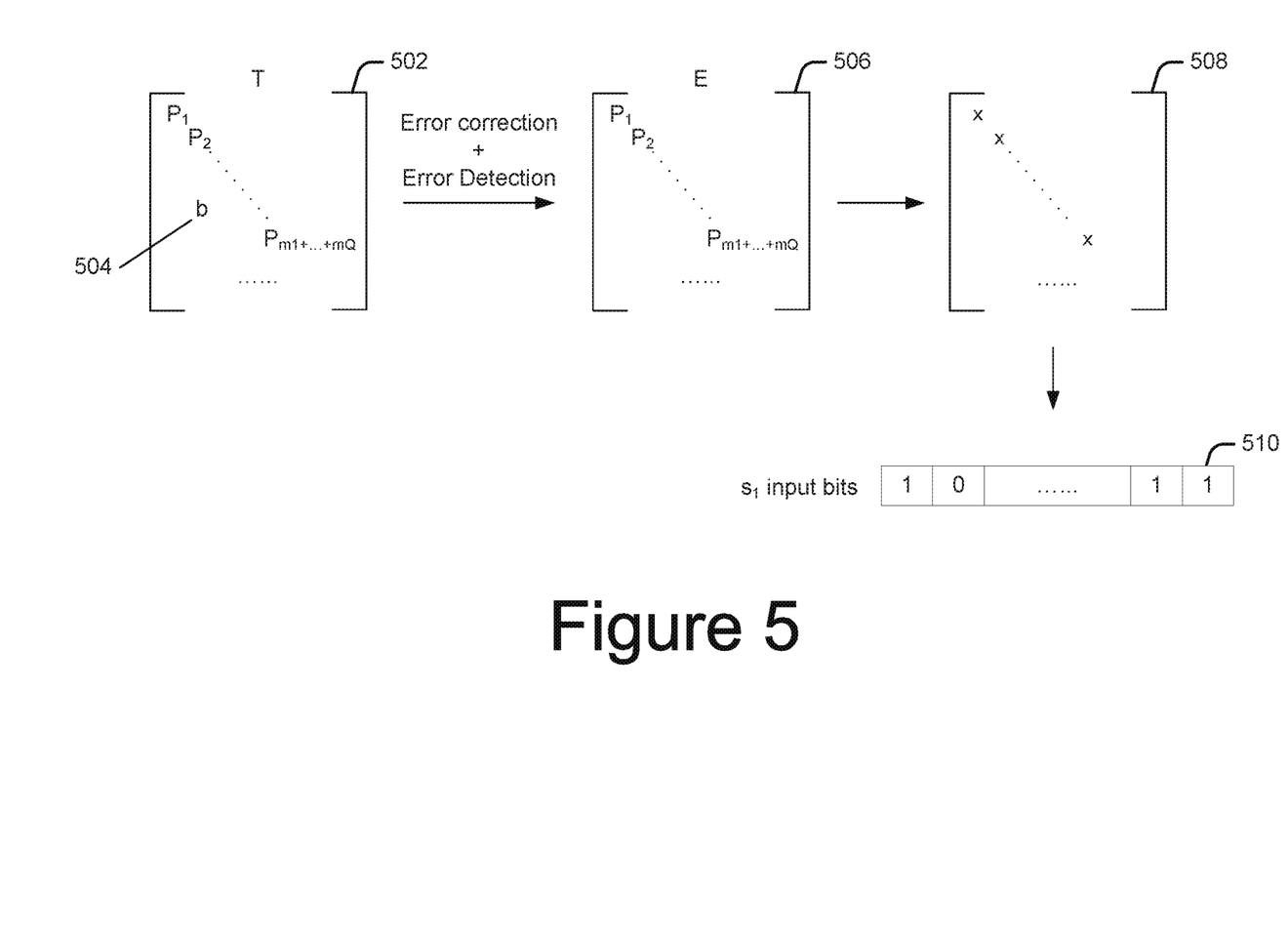
FIG. 5 shows retrieving $s_1$ input bits of an input data from a retrieved bit pattern, according to an example of the present subject matter.

FIG. 5 shows an illustrative example of retrieving $s_1$ input bits of an input data from a retrieved bit pattern T, as described above. Referring to FIG. 5, let the retrieved bit pattern T, referenced by 502, has one bit-transition error at a position indicated by 504. The bits in the retrieved bit pattern T are arranged in a vector s". The vector s" is multiplied by the parity-check matrix H to obtain the syndrome S. Based on the syndrome S, the error vector a is computed, and the error vector ê is added to the vector s" to produce a bit pattern reference by 506. The bit pattern referenced by 506 is the same as the encoded bit pattern E referenced by 408 in FIG. 4. Thus, the bit pattern referenced by 506 includes the row-wise appended sub-arrays $B_1$, $B_2, \ldots, B_Q, B_{Q+1}$, or having the row-wise appended sub-arrays $B_1, B_2, \ldots, B_Q$ and the permutation matrices, as described earlier in the description.

After this, bits in the diagonal positions of the bit pattern 506, except for the bits in the diagonal positions due to the rows added from the $Q+1^{th}$ iteration, are removed as illustrated by 508. The last appended sub-array $B_{Q+1}$ is decoded, by reversing the steps followed for generating the last appended sub-array $B_{Q+1}$, to obtain bits for the empty diagonal positions that belong to the previous sub-array $B_Q$ and obtain the balancing termination indices for this sub-array $B_Q$. The obtained bits are inserted in the empty diagonal positions at the rows corresponding to the sub-array $B_Q$. Based on the obtained balancing termination indices, the column balance coding is reversed to obtain the sub-array $A_Q$ from the sub-array $B_Q$. The rows of the sub-array $A_Q$ are then decoded to obtain the set of $s_Q$ bits, which is then parsed to obtain bits for the empty diagonal positions at the rows corresponding to the previous sub-array $B_{Q-1}$ and obtain the balance termination indices for the sub-array $B_{Q-1}$. The decoding procedure is iteratively repeated to obtain each of the previous sub-arrays B's till the first sub-array $B_1$. The first sub-array $B_1$ is then decoded by reversing the column balance coding using the balancing termination indices for the first sub-array $B_1$ to obtain the sub-array $A_1$. The rows of the sub-array $A_1$ are then decoded to obtain the set of $s_1$ bits. These $s_1$ bits are the same as the $s_1$ input bits of the input data. The set of $s_1$ bits, retrieved through the decoding procedure, as described above, is referenced by 510.

Figure 6:
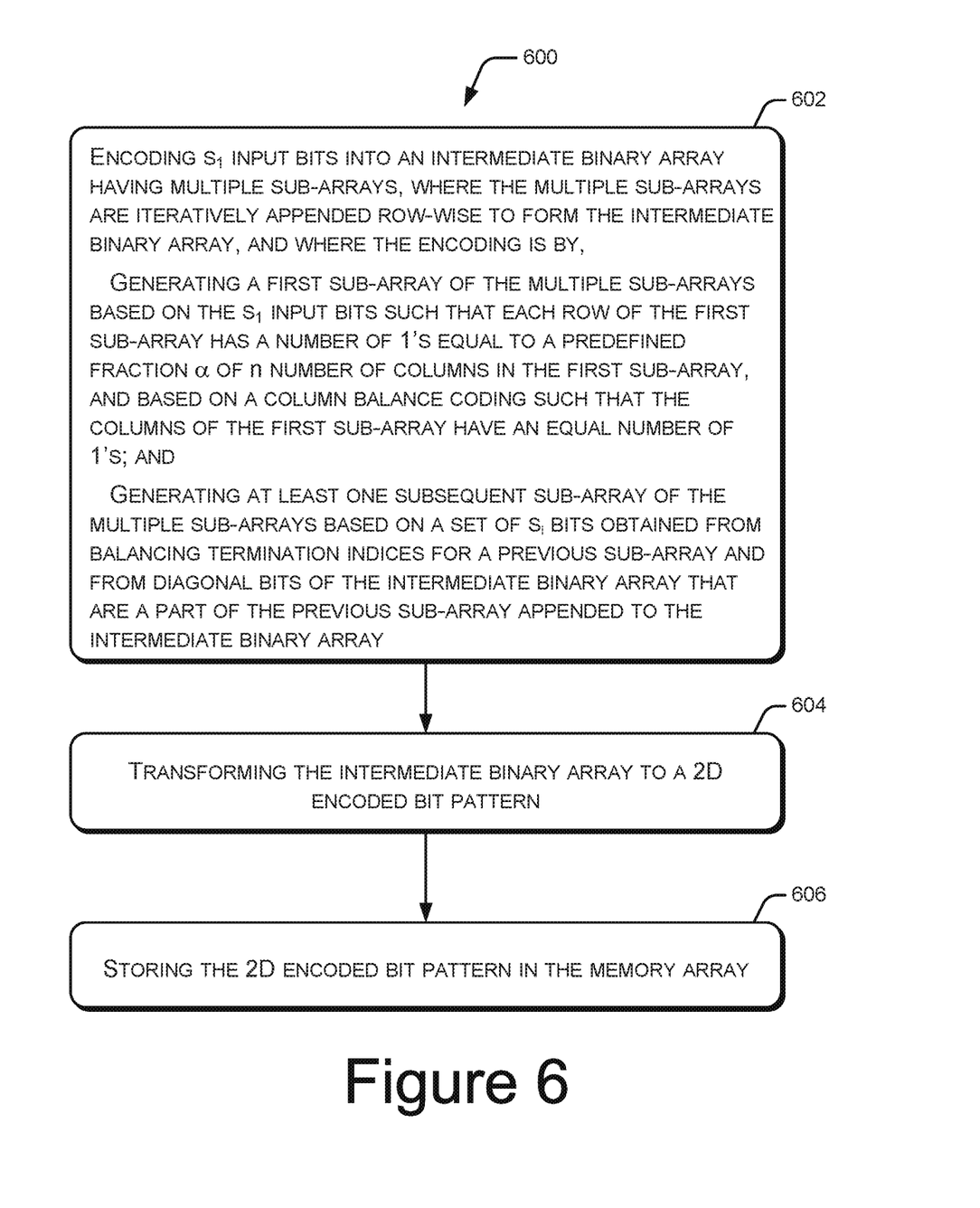
FIG. 6 illustrates a method of storing data into a memory array, according to an example of the present subject matter.

FIG. 6 illustrates a method 600 of storing data into a memory array, according to an example of the present subject matter. The order in which the method 600 is described is not intended to be construed as a limitation, and any number of the described method blocks can be combined in any order to implement the method 600, or an alternative method. It may be understood that steps of the method 600 can be performed by programmed memory controllers.

Further, although the method 600 of storing data into a memory array may be implemented in a variety of data storage systems; in an example implementation described in FIG. 6, the method 600 is explained in context of the aforementioned data storage system 200 having the memory array 100 having memory devices, such as memristors, in m rows and n columns.

Referring to FIG. 6, at block 602, $s_1$ input bits are encoded into an intermediate binary array having multiple sub-arrays. The intermediate binary array is formed by iteratively row-wise appending of the multiple sub-arrays. In encoding the $s_1$ input bits, a first sub-array of the multiple sub-arrays is generated based on the $s_1$ input bits such that each row of the first sub-array has a number of 1's equal to a predefined fraction $\alpha$ of n number of columns in the first sub-array, and based on a column balance coding such that the columns of the first sub-array have an equal number of 1's. In encoding the $s_1$ input bits, at least one subsequent sub-array of the multiple sub-arrays is generated based on a set of $s_i$ bits obtained from balance termination indices for a previous sub-array and from diagonal bits of the intermediate binary array that are a part of the previous sub-array appended to the intermediate binary array. The $s_1$ input bits may be encoded into the intermediate binary array by the encoder 204 of the data storage system 200, as described earlier in the description.

At block 604, the intermediate binary array is transformed to a 2D encoded bit pattern. In an example implementation, the intermediate binary array is transformed to the 2D encoded bit pattern with error correction party bits. The error correction parity bits enable detection and correction of bit-transition errors occurring during storage of the 2D encoded bit pattern in, and retrieval of the 2D encoded bit pattern from, the memory array, as described earlier in the description. The intermediate binary array may be transformed to the 2D encoded bit pattern by the encoder 204 of the data storage system 200, as described earlier in the description.

At block 606, the 2D encoded bit pattern is stored in the memory devices of the memory array 100. The 2D encoded bit pattern may be stored in the memory array 100 by the write controller 206 of the data storage system 200. With this, a number of memory devices in each row and each column of the m×n memory array 100 having a same state is about the predefined fraction $\alpha$ of n number of columns and the predefined fraction $\alpha$ of m number of rows, respectively.

Further, the memory devices in the memory array 100 may be read to retrieve a bit pattern stored in the memory array 100. The retrieved bit pattern may be decoded to detect and correct bit-transition errors in the retrieved bit pattern to obtain the 2D encoded bit pattern. Based on the obtained 2D encoded bit pattern, the last appended sub-array may be decoded to obtain bits for balance termination indices for the previous appended sub-array and bits for the diagonal positions that are a part of the previous appended sub-array in the 2D encoded bit pattern. With this, the previous appended sub-array in the 2D encoded bit pattern is obtained. Each sub-array may, in turn, be decoded by reversing the column balance coding using the balance termination indices and decoding the rows to obtain the corresponding balance termination indices and diagonal bits for the previous appended sub-array in the 2D encoded bit pattern. With this, the intermediate binary array which is the same as obtained during the encoding stage is reconstructed. In the last stage, the first sub-array in the 2D encoded bit pattern may be decoded to extract the $s_1$ input bits, i.e., the input data, in the original form. The $s_1$ input bits may be extracted by the decoder 210 of the data storage system 200, as described earlier in the description.

Although implementations for storing data into a memory array have been described in language specific to structural features and/or methods, it is to be understood that the present subject matter is not necessarily limited to the specific features or methods described. Rather, the specific features and methods are disclosed and explained as example implementations for storing data into a memory array of a data storage system.

We claim:

1. A method of storing data in a memory array of a plurality of memristors, the method comprising:

encoding $s_1$ input bits into an intermediate binary array comprising multiple sub-arrays, wherein the multiple sub-arrays are iteratively appended row-wise to form the intermediate binary array, wherein the encoding comprises:

generating a first sub-array of the multiple sub-arrays based on the $s_1$ input bits such that each row of the first sub-array has a number of 1's equal to a predefined fraction $\alpha$ of n number of columns in the first sub-array, and based on a column balance coding such that the columns of the first sub-array have an equal number of 1's; and generating at least one subsequent sub-array of the multiple sub-arrays based on a set of $s_i$ bits obtained from balancing termination indices for a previous sub-array and from diagonal bits of the intermediate binary array that are a part of the previous sub-array appended to the intermediate binary array;

transforming the intermediate binary array to a 2D encoded bit pattern having a configuration including the first sub-array; and storing the 2D encoded bit pattern in the memristors of the memory array, wherein the 2D encoded bit pattern having the configuration including the first sub-array in which each row has the number of 1's equal to the predefined fraction α of the n number of the columns in the first sub-array reduces parasitic current during reading and writing of the memristors of the memory array in which the 2D encoded bit pattern has been stored.

2. The method as claimed in claim 1, wherein the generating the first sub-array comprises:

distributing the $s_1$ input bits into $m_1$ groups of b bits or less than b bits, wherein $m_1$ is a smallest integer multiple of the inverse of the predefined fraction a, and no smaller than $s_1/b$;

when $m_1$ is more than the inverse of the predefined fraction α, coding each of the $m_1$ groups into a respective binary vector of length n having α×n number of 1's;

arranging $m_1$ vectors, based on the coding, row-wise to form an $m_1$×n array; and performing the column balance coding on the $m_1$×n array; and wherein the method further comprises appending the first sub-array row-wise to the intermediate binary array, wherein the intermediate binary array is a null array initially.

3. The method as claimed in claim 1, wherein the generating the at least one subsequent sub-array comprises:

distributing the set of $s_i$ bits into $m_i$ groups of b bits or less than b bits, wherein $m_i$ is a smallest integer multiple of the inverse of the predefined fraction α, and no smaller than $s_i/b$;

when $m_i$ is more than the inverse of the predefined fraction α, coding each of the $m_i$ groups into a respective binary vector of length n having α×n number of 1's;

arranging $m_i$ vectors, based on the coding, row-wise to form an $m_i$×n array; and performing the column balance coding on the $m_i$×n array; and wherein the method further comprises appending the at least one subsequent sub-array row-wise to the intermediate binary array.

4. The method as claimed in claim 1, wherein the generating the at least one subsequent sub-array comprises:

distributing the set of $s_i$ bits into $m_i$ groups of b bits or less than b bits, wherein $m_i$ is a smallest integer multiple of the inverse of the predefined fraction α, and no smaller than $s_i/b$;

when $m_i$ is less than or equal to the inverse of the predefined fraction α, coding each of the $m_i$ groups into a respective binary vector of length n having α×n number of 1's; and arranging $m_i$ vectors, based on the coding, row-wise to form an $m_i$×n array; and wherein the method further comprises appending the at least one subsequent sub-array row-wise to the intermediate binary array.

5. The method as claimed in claim 1, wherein the generating the at least one subsequent sub-array comprises:

distributing the set of $s_i$ bits into $m_i$ groups of b bits or less than b bits, wherein $m_i$ is a smallest integer multiple of the inverse of the predefined fraction α, and no smaller than $s_i/b$; and when $m_i$ is less than or equal to the inverse of the predefined fraction α, coding the set of $s_i$ bits into $1/\alpha \times 1/\alpha$ permutation matrices; and wherein the method further comprises appending the at least one subsequent sub-array, based on the $1/\alpha \times 1/\alpha$ permutation matrices, to the intermediate binary array.

6. The method as claimed in claim 1, wherein the transforming comprises generating the 2D encoded bit pattern with error correction parity bits to enable detection and correction of bit-transition errors occurring during storage of the 2D encoded bit pattern in, and retrieval of the 2D encoded bit pattern from, the memory array, wherein the transforming comprises:

reserving diagonal positions in the intermediate binary array, except for positions in a last appended sub-array, for the error correction parity bits;

coding bits in non-reserved positions in the intermediate binary array to compute the error correction parity bits; and inserting the error correction parity bits in the reserved diagonal positions.

7. The method as claimed in claim 1, wherein the performing the column balance coding comprises:

for n equal to $2^k$ where k is an integer, iteratively modifying an array of n columns k times, wherein the $i^{th}$ iteration comprises:

partitioning columns of the array of n columns into $2^i$ contiguous column groups with each column group having equal number of columns;

pairing each two adjacent column groups, from the $2^i$ contiguous column groups, to form $2^{i-1}$ disjoint pairs of column groups; and for each of the disjoint pairs of column groups, switching $j^{th}$ bit in one column group with $j^{th}$ bit in other column group until column groups of the respective disjoint pair have an equal number of 1's.

8. The method as claimed in claim 7 further comprising obtaining the set of bits for generating a subsequent sub-array, wherein the obtaining the set of bits comprises:

based on the column balance coding for a previous sub-array, coding a balancing termination index for each of the k iterations and for each disjoint pair of column groups for the previous sub-array into a binary vector, wherein the balancing termination index is indicative of position of $j^{th}$ bit in a column group at which the switching terminates for the previous sub-array;

concatenating binary vectors obtained based on the coding of balancing termination indices for the k iterations; and appending the diagonal bits of the intermediate binary array that are a part of the previous sub-array to the concatenated binary vectors.

9. The method as claimed in claim 6 further comprising:

reading a bit pattern from the memory array;

decoding the bit pattern to detect and correct the bit-transition errors in the bit pattern to obtain the 2D encoded bit pattern;

based on the 2D encoded bit pattern, decoding a last appended sub-array to obtain balance termination indices for a previous appended sub-array and bits for the diagonal positions in the 2D encoded bit pattern that are a part of the previous appended sub-array;

decoding each appended sub-array, in turn, by reversing the column balance coding based on respective balance termination indices and decoding rows of the respective appended sub-array to obtain balance termination indices for a respective previous appended sub-array and bits for the diagonal positions that are a part of the respective previous appended sub-array; and decoding the first sub-array to extract the $s_1$ input bits.

10. A data storage system comprising:

a memory array having memristor memory devices in a crossbar configuration; and a memory controller for controlling data storage in the memory array, the memory controller comprising:

an encoder to generate a first sub-array based on $s_1$ input bits such that each row of the first sub-array has a number of 1's equal to a predefined fraction $\alpha$ of n number of columns in the first sub-array, and based on a column balance coding such that the columns of the first sub-array have an equal number of 1's;

append the first sub-array to an intermediate binary array, wherein the intermediate binary array is a null array initially;

generate at least one subsequent sub-array based on a set of $s_i$ bits obtained from balancing termination indices for a previous sub-array and from diagonal bits of the intermediate binary array that are a part of the previous sub-array appended to the intermediate binary array;

append the at least one subsequent sub-array to the intermediate binary array; and transform the intermediate binary array into a 2D encoded bit pattern having a configuration including the first sub-array; and a write controller to write the 2D encoded bit pattern into the memristor memory devices of the memory array, wherein the 2D encoded bit pattern having the configuration including the first sub-array in which each row has the number of 1's equal to the predefined fraction a of the n number of the columns in the first sub-array reduces parasitic current during reading and writing of the memristor memory devices of the memory array in which the 2D encoded bit pattern has been stored.

11. The data storage system as claimed in claim 10, wherein, to generate the first sub-array, the encoder distributes the $s_1$ input bits into $m_1$ groups of b bits or less than b bits, wherein $m_1$ is a smallest integer multiple of the inverse of the predefined fraction $\alpha$, and no smaller than $s_1/b$;

when $m_1$ is more than the inverse of the predefined fraction $\alpha$, codes each of the $m_1$ groups into a respective binary vector of length n having $\alpha \times n$ number of 1's;

arranges $m_1$ vectors row-wise to form an $m_1 \times n$ array; and performs the column balance coding on the $m_1 \times n$ array.

12. The data storage system as claimed in claim 10, wherein, to generate the at least one subsequent sub-array, the encoder distributes the set of $s_i$ bits into $m_i$ groups of b bits or less than b bits, wherein $m_i$ is a smallest integer multiple of the inverse of the predefined fraction $\alpha$, and no smaller than $s_i/b$;

when $m_i$ is more than the inverse of the predefined fraction $\alpha$, codes each of the $m_i$ groups into a respective binary vector of length n having $\alpha \times n$ number of 1's;

arranges $m_i$ vectors row-wise to form an $m_i \times n$ array; and performs the column balance coding on the $m_i \times n$ array.

13. The data storage system as claimed in claim 10, wherein, to generate the at least one subsequent sub-array, the encoder distributes the set of $s_i$ bits into $m_i$ groups of b bits or less than b bits, wherein $m_i$ is a smallest integer multiple of the inverse of the predefined fraction $\alpha$, and no smaller than $s_i/b$;

when $m_i$ is less than or equal to the inverse of the predefined fraction $\alpha$, codes each of the $m_i$ groups into a respective binary vector of length n having $\alpha \times n$ number of 1's; and arranges $m_i$ vectors row-wise to form an $m_i \times n$ array.

14. The data storage system as claimed in claim 10, wherein, to generate the at least one subsequent sub-array, the encoder distributes the set of $s_i$ bits into $m_i$ groups of b bits or less than b bits, wherein $m_i$ is a smallest integer multiple of the inverse of the predefined fraction $\alpha$, and no smaller than $s_i/b$; and when $m_i$ is less than or equal to the inverse of the predefined fraction $\alpha$, codes the set of $s_i$ bits into $1/\alpha \times 1/\alpha$ permutation matrices.

15. The data storage system as claimed in claim 10, wherein, to transform the intermediate binary array, the encoder generates the 2D encoded bit pattern with error correction parity bits to enable detection and correction of bit-transition errors occurring during storage of the 2D encoded bit pattern in, and retrieval of the 2D encoded bit pattern from, the memory array, wherein, to generate the 2D encoded bit pattern, the encoder reserves diagonal positions in the intermediate binary array, except for positions in a last appended sub-array, for the error correction parity bits;

codes bits in non-reserved positions in the intermediate binary array to compute the error correction parity bits; and inserts the error correction parity bits in the reserved diagonal positions.

* * * * *